United States Patent
Brandt

(10) Patent No.: US 7,062,237 B2
(45) Date of Patent: Jun. 13, 2006

(54) POWER AMPLIFIER (PA) WITH IMPROVED POWER REGULATION

(75) Inventor: Per-Olof Brandt, Lomma (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 1010 days.

(21) Appl. No.: 09/874,130

(22) Filed: Jun. 5, 2001

(65) Prior Publication Data

US 2002/0183021 A1 Dec. 5, 2002

(51) Int. Cl.
*H04B 1/04* (2006.01)

(52) U.S. Cl. .................. 455/127.1; 455/127.2; 455/127.3; 455/115

(58) Field of Classification Search .............. 455/127.1, 455/127.3
See application file for complete search history.

(56) References Cited

U.S. PATENT DOCUMENTS

| | | | |
|---|---|---|---|
| 3,449,680 A | 6/1969 | Schilb et al. ................. | 330/11 |
| 6,008,698 A | 12/1999 | Dacus et al. ................. | 330/279 |
| 6,430,402 B1 * | 8/2002 | Agahi-Kesheh .......... | 455/115.3 |
| 6,633,750 B1 * | 10/2003 | Dacus et al. ................. | 455/126 |

OTHER PUBLICATIONS

Standard Search Report as Prepared by the ISA/EP in connection with U.S. patent application No. 09/874,130 as filed on Jun. 5, 2001.

* cited by examiner

*Primary Examiner*—Ahmad F. Matar
*Assistant Examiner*—Hector Agdeppa

(57) ABSTRACT

A circuit for regulating the power provided to a load connected to an output of a power amplifier. The circuit includes an amplitude detector that outputs a voltage corresponding to the amplitude of the signal outputted by the power amplifier. This output voltage is a function of the impedance of the load. Thus, when the impedance of the load changes, the output voltage also changes. Given a constant current into the load, it is the load impedance that determines the power delivered to the load. Therefore, because the output voltage reflects changes in the impedance of the load, the output voltage can be used by a regulator circuit to maintain a constant output power, regardless of changes in the impedance of the load.

17 Claims, 5 Drawing Sheets

US 7,062,237 B2

POWER AMPLIFIER (PA) WITH IMPROVED POWER REGULATION

BACKGROUND OF THE INVENTION

1. Field of the Invention

The present invention is generally related to power amplifiers, and, more specifically, to a system and method for regulating the power produced by a power amplifier.

2. Discussion of the Background

In certain communication systems, for example, the Global System for Mobile Communication (GSM), the output power of a transmitter within a communication device (e.g., a mobile phone) has to be well controlled due to the specifications of the communication system. In transmitters used in GSM and GSM like systems, the output power of the transmitter is generated by a power amplifier, which is controlled by a control circuit.

The output power (P) of a power amplifier is a function of load impedance (R), as shown by the following formula: $P=I^2R$, where I is the current provided to the load from the power amplifier. Thus, if the load impedance (R) changes, the output power (P) will change (assuming I is kept constant). Changes to the load impedance are commonly caused by environmental factors. For example, if the load is an antenna of a transmitter for transmitting signals, the load impedance is dependent upon the environment surrounding the antenna. As an example, if a mobile phone is held in the hand, the impedance "felt" by the power amplifier may be different from the impedance felt by the power amplifier when the mobile phone is sitting on a table or in a car. Because the output power must be well controlled, it is desired to keep the output power constant, regardless of changes in the load impedance.

Conventionally, the output power has been controlled though the use of a current detector. FIG. 1 illustrates a conventional circuit for controlling the output power of a power amplifier 102. As shown in FIG. 1, the current ($I_1$) flowing into power amplifier 102 is measured. $I_1$ is a good measure of the power produced by power amplifier 102. This current is measured by measuring the voltage at node N1. This voltage is referred to as Vsense. By Ohm's law, Vsense is related to ($I_1$) as follows: Vsense=Vbat−($I_1$)R1, where Vbat is the voltage produced by power source 110. L1 is an RF-choke inductor. A control circuit 108 compares Vsense to a reference voltage (Vref). Control circuit 108 controls the output power of power amplifier 102 based on the result of the comparison between Vsense and Vref. In this manner, the circuit shown in FIG. 1 may control the output power of power amplifier 102 based on the measured current ($I_1$) flowing into the power amplifier 102. The circuit shown in FIG. 1 suffers from several disadvantages, one of which is that it has difficulty achieving high dynamics.

What is desired, therefore, is a system and/or method to improve the power regulation of a power amplifier circuit.

SUMMARY OF THE INVENTION

Embodiments of the present invention provide a system and method for improving the power regulation of a power amplifier circuit. More specifically, the present invention improves control of output power in the situations where there is an impedance mismatch at the output.

According to one embodiment, a method of the present invention includes the steps of (1) comparing a measured signal to a reference signal, wherein the measured signal represents the sum of the amplitude of the output voltage of the power amplifier and a current flowing into the power amplifier from a power supply connected to the power amplifier and (2) controlling the power amplifier based on the result of the comparison between the measured signal and the reference signal.

According to one embodiment, a circuit of the present invention includes a current detector for measuring the current flowing into the power amplifier from a power supply, an amplitude detector that measures the amplitude of the output voltage of the power amplifier, an adder for summing the output of the current detector and the amplitude detector, and a control circuit connected to a biasing pin of the power amplifier that compares the output of the adder to a reference signal and controls the power amplifier based on the result of the comparison between the reference signal and the output of the adder.

The output of the adder changes as the impedance of the load on the power amplifier changes. Thus, because the output of the control circuit will change when the output of the adder changes, the output of the control circuit changes when the impedance of the load changes. Because the output of the control circuit is connected to the biasing input of the power amplifier, the output of the control circuit controls the current delivered by the power amplifier to the load, and, hence, controls the power delivered to the load. When the impedance of the load changes, the control circuit increases or decreases the current delivered to the load, depending on the change in the impedance of the load. In this manner, the control circuit regulates the power delivered by the power amplifier to the load and can keep the output power constant, regardless of changes in the load.

Further features and advantages of the present invention, as well as the structure and operation of various embodiments of the present invention, are described in detail below with reference to the accompanying drawings.

It should be emphasized that the term "comprises/comprising" when used in this specification is taken to specify the presence of stated features, integers, steps, or components but does not preclude the presence or addition of one or more other features, integers, steps, components or groups thereof.

BRIEF DESCRIPTION OF THE DRAWINGS

The accompanying drawings, which are incorporated herein and form part of the specification, illustrate various embodiments of the present invention and, together with the description, further serve to explain the principles of the invention and to enable a person skilled in the pertinent art to make and use the invention. In the drawings, like reference numbers indicate identical or functionally similar elements. Additionally, the left-most digit(s) of a reference number identifies the drawing in which the reference number first appears.

DETAILED DESCRIPTION OF THE EMBODIMENTS

Figure 6:
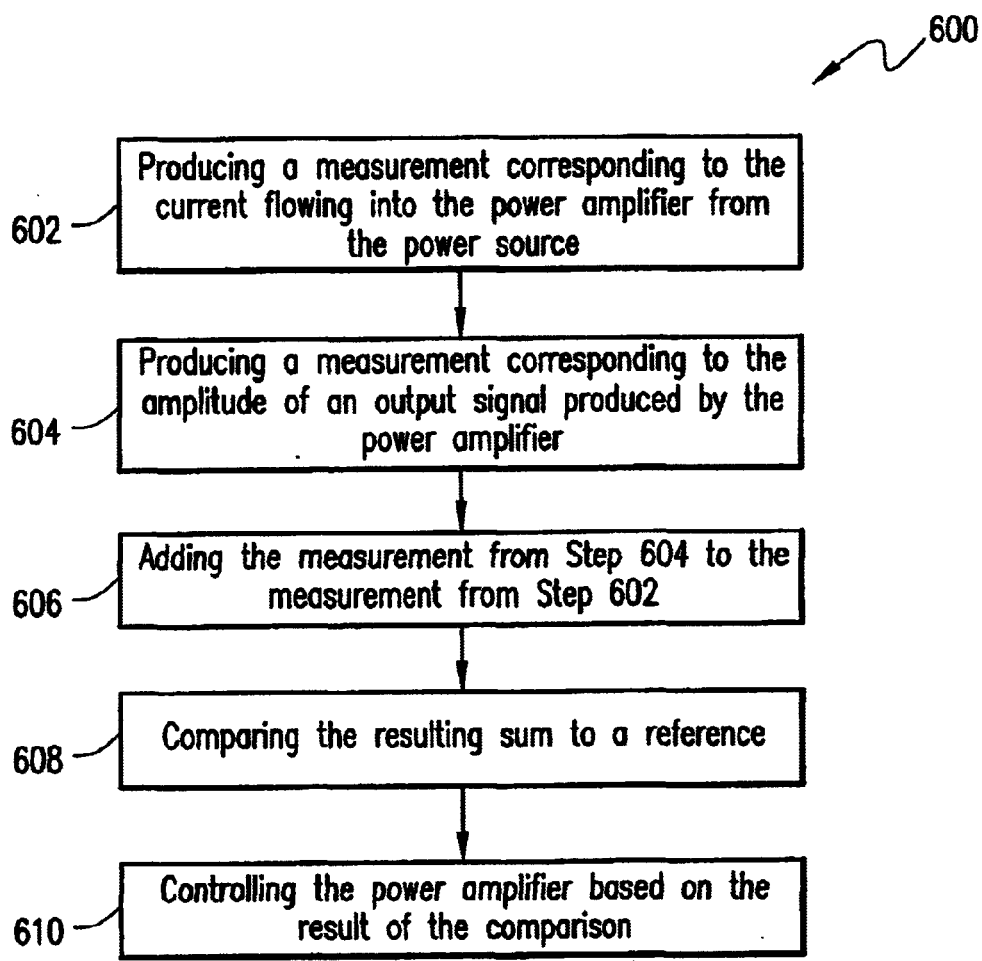
FIG. 6 is a flowchart illustrating a process, according to one embodiment of the invention, for controlling the output power of a power amplifier circuit.

Referring first to FIG. 6, FIG. 6 is a flow chart illustrating a process 600, according to one embodiment of the invention, for controlling the output power of a power amplifier circuit. Process 600 begins with step 602, wherein a measurement corresponding to a current flowing into the power amplifier from a power source is produced. In step 604, a measurement corresponding to the amplitude of an output signal produced by the power amplifier is produced. In step 606, the measurements from step 602 and 604 are added together. In step 608, the resulting sum is compared to a reference. In step 610, the power amplifier is controlled based on the result of the comparison. In this manner, the method of the present invention regulates the output power of a power amplifier circuit.

Figure 1:
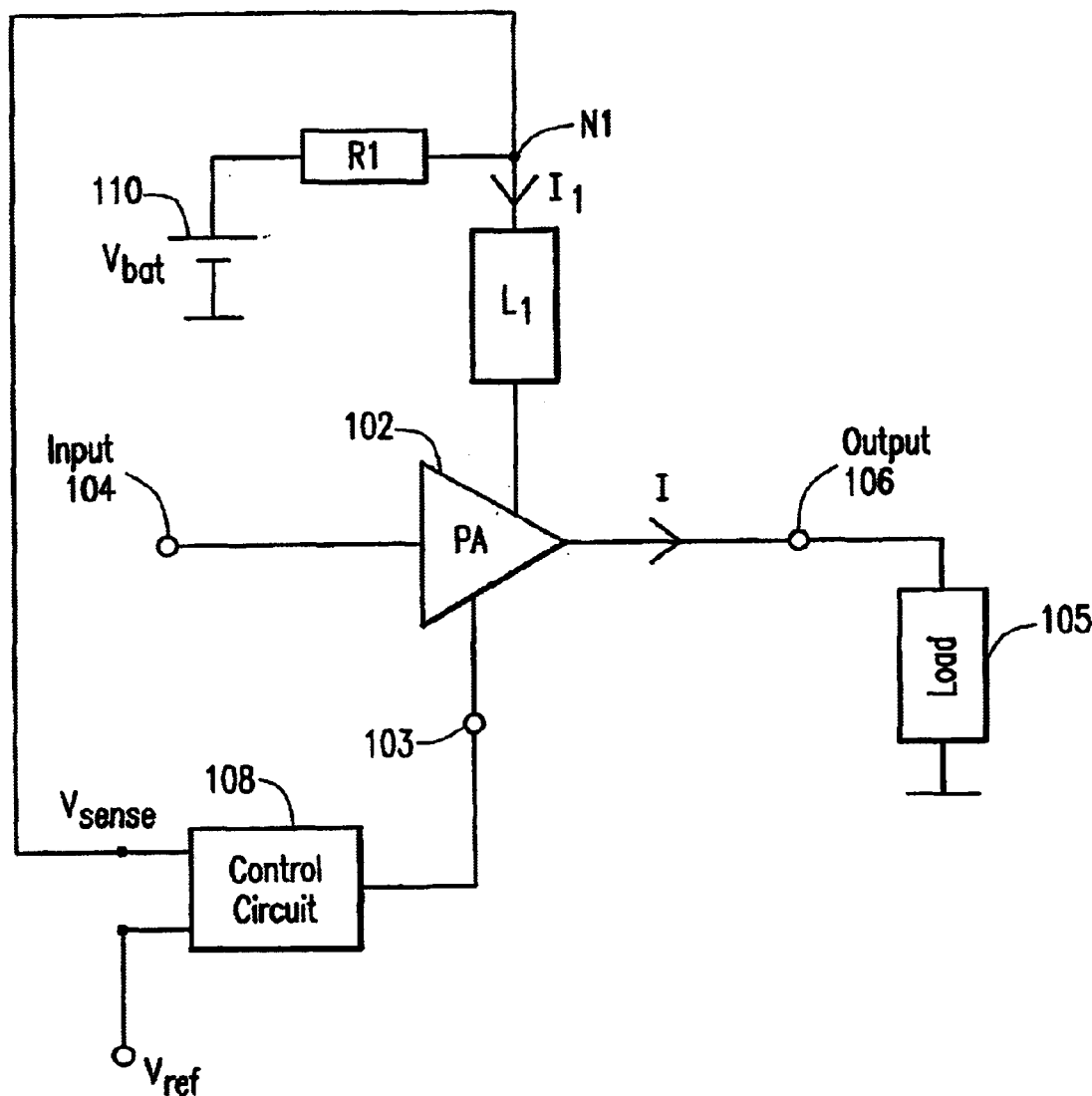
FIG. 1 illustrates a conventional circuit for controlling the output power of a power amplifier.
Figure 2:
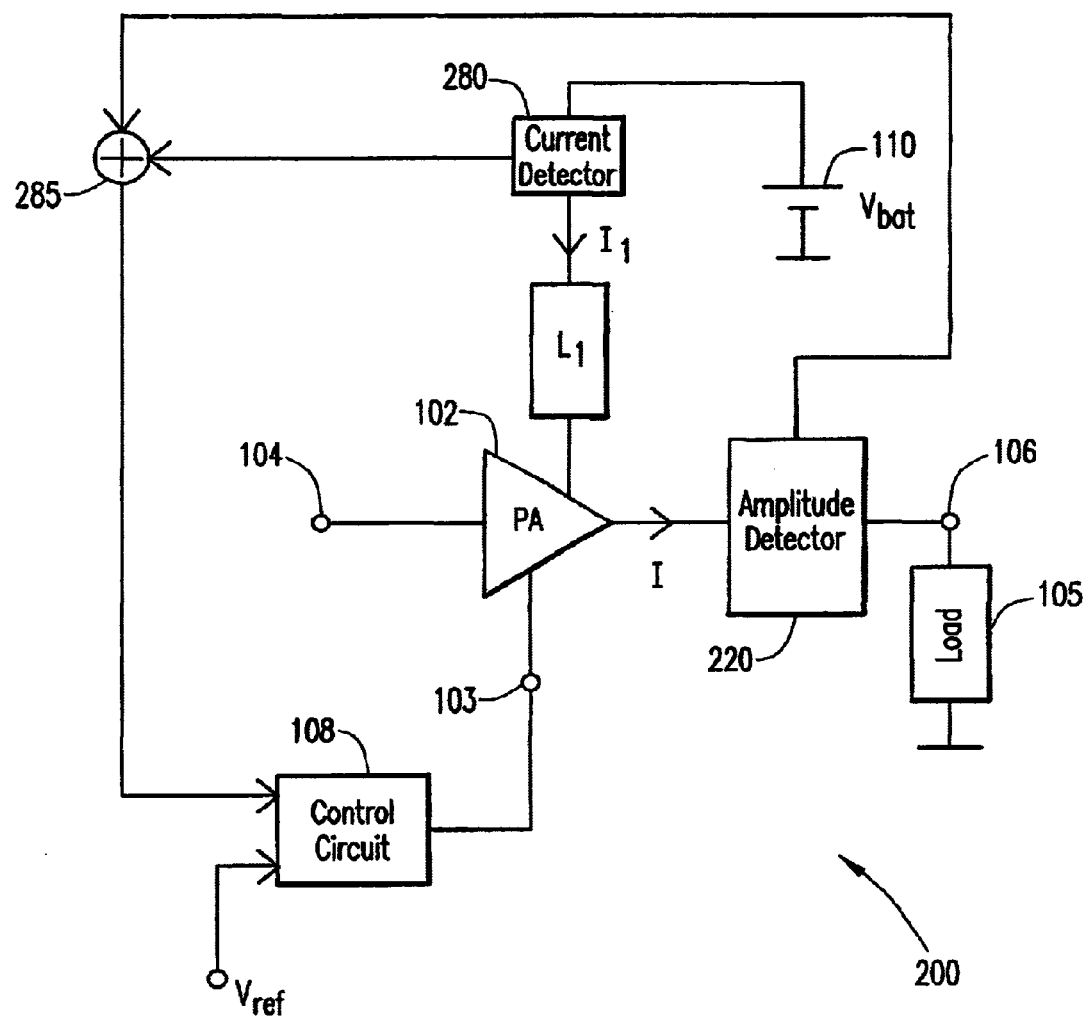
FIG. 2 is a high level circuit diagram illustrating an embodiment of the invention.

Referring now to FIG. 2, FIG. 2. illustrates a high level circuit diagram that illustrates a power amplifier circuit 200 according to one embodiment. Power amplifier circuit 200 includes power amplifier 102 that functions to receive an input signal at its input 104 and to amplify the input signal to produce an output signal at its output 106.

Circuit 200 also includes a control circuit 108 for controlling the output power of power amplifier 102. More specifically, control circuit 108 functions to keep the output power of power amplifier 102 constant, regardless of changes in the impedance of a load 105 connected to the output 106 of power amplifier 102. The output of control circuit 108 is connected to a biasing control pin 103 of power amplifier 102. Thus, the output of control circuit 108 affects the amount of current (I) provided to load 105.

Circuit 200 also includes power source 110 (Vbat) that provides power to power amplifier 102, a current detector 280 for measuring the current flowing out of power source 110, an amplitude detector 220 for measuring the amplitude of the output signal of power amplifier 102, and an adder 285 for adding the outputs of current detector 280 and amplitude detector 220. The output of adder 285 is provided to an input of control circuit 108. Provided to another input of control circuit 108 is the reference signal (Vref). Controller 108 controls power amplifier 102 based on the difference between the output of adder 285 and the reference signal.

In one embodiment, control circuit 108 is a comparator. That is, control circuit 108 compares the output of adder 285 to the reference signal and outputs a voltage that corresponds to the difference between the two inputs. The output of adder 285 changes when the real part of the impedance of load 105 changes. Thus, because the output of control circuit 108 will change when the output of adder 285 changes, the output of control circuit 108 changes when the impedance of load 105 changes. As discussed above, the output of control circuit 108 affects the current (I) delivered by power amplifier 102 to load 105. Consequently, when the impedance of load 105 changes, control circuit 108 increases or decreases the current delivered to load 105, depending on the impedance of load 105. In this manner, control circuit 108 regulates the power delivered by power amplifier 102 to load 105 and can keep the output power constant, regardless of changes in the load.

Figure 3:
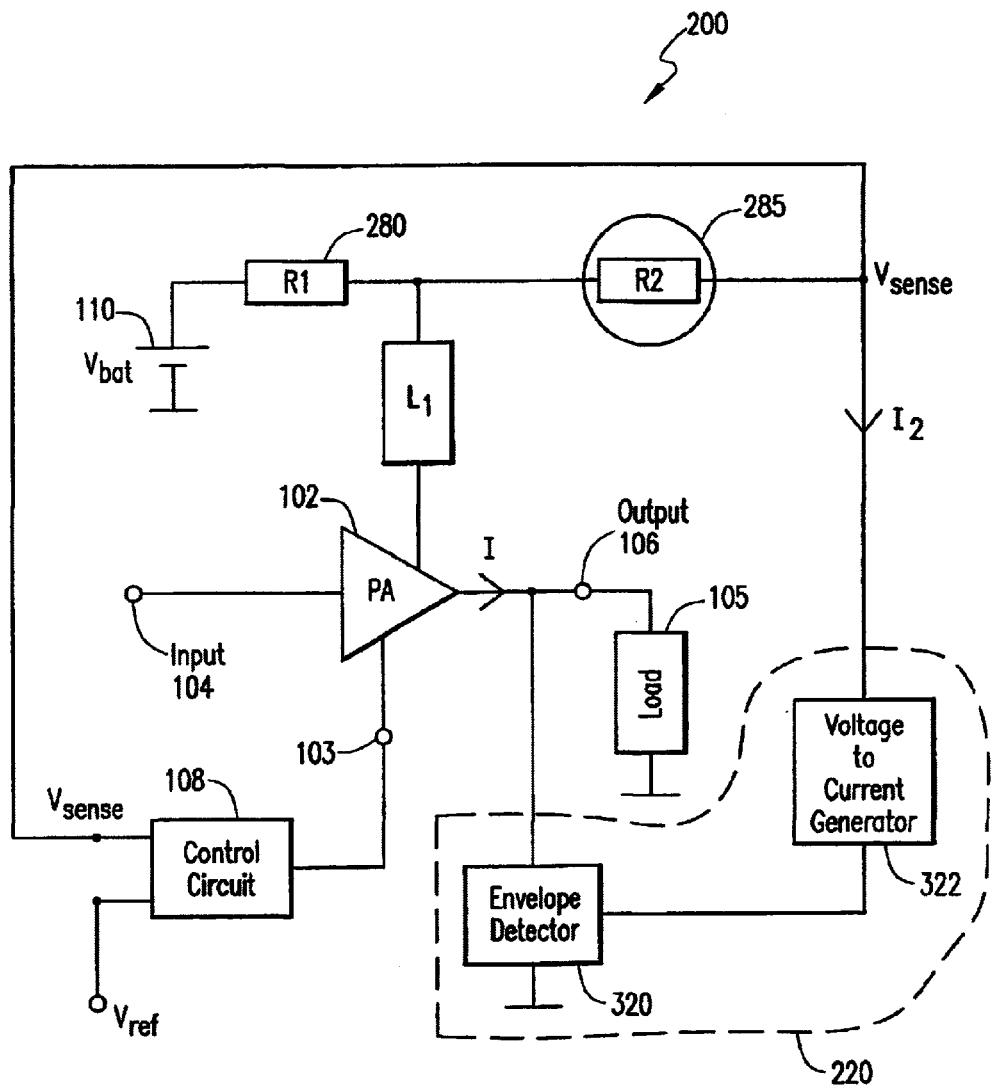
FIG. 3 depicts one possible implementation of the high level circuit shown in FIG. 2.

FIG. 3 illustrates circuit 200 in greater detail according to one embodiment. One skilled in the art will recognize that there are a wide variety of ways to implement circuit 200 and that FIG. 3 is used merely for illustration and not limitation. As shown in FIG. 3, current detector 280 is implemented with a resistor (R1), adder 285 is implemented with a resistor (R2), and amplitude detector 220 is implemented with an envelope detector 320 and a voltage to current generator 322.

Detector circuit 320 functions to output a voltage that corresponds to the amplitude of the output signal produced by power amplifier 102. Voltage to current generator 322 receives as input the output of detector circuit 320. The output of generator 322 is connected to adder 285. Generator 322 converts the voltage outputted by circuit 320 to a current $I_2$. This current is drawn through resistors R1 and R2 (R2 is preferably greater than R1).

Figure 4:
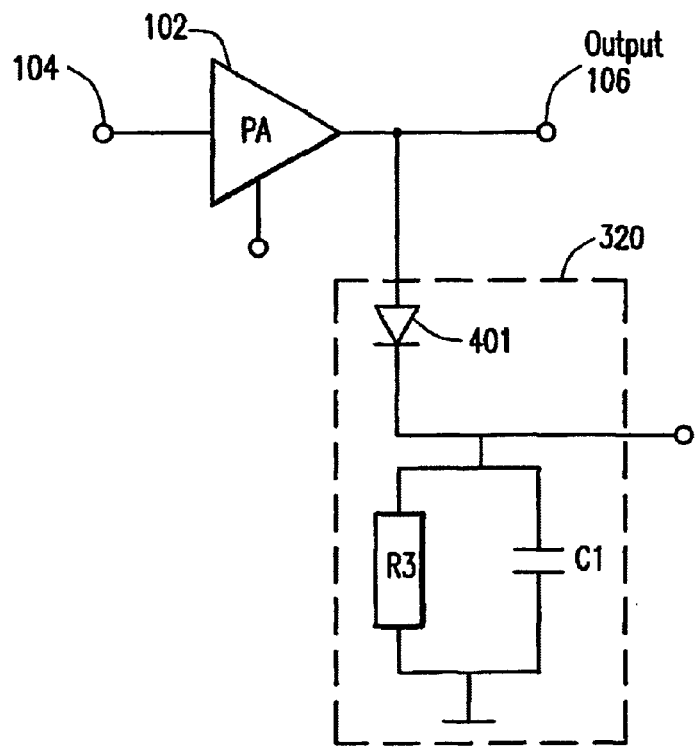
FIG. 4 is a schematic of one embodiment of an amplitude detector circuit.

Referring now to FIG. 4, FIG. 4 is a schematic of one embodiment of detector circuit 320. As shown in FIG. 4, detector circuit 320 includes a diode 401 connected in series with a resistance (R3) connected in parallel with a capacitance (C1). The input to the detector circuit 320 is the output 106 of power amplifier 102. The output of detector circuit 320 is a voltage that corresponds to the amplitude of the output signal 106 of power amplifier 102. For this reason, detector circuit 320 is also referred to as an amplitude detector or envelope detector. One skilled in the art will recognize that there are a wide variety of ways to implement circuit 320 and that FIG. 4 is used merely for illustration and not limitation.

Figure 5:
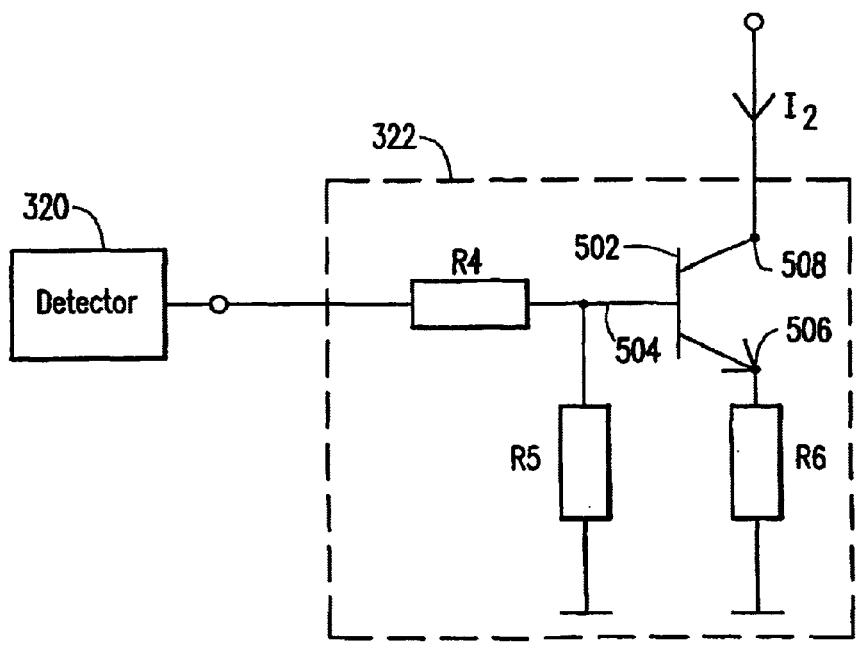
FIG. 5 is a schematic of one embodiment of a voltage to current generator.

Referring now to FIG. 5, FIG. 5 is a schematic of one embodiment of voltage to current generator 322. As shown in FIG. 5, generator 322 includes a bi-polar junction transistor 502. The input of generator 322 is connected to the base 504 of transistor 502 through a resistance (R4). The base 504 is also connected to ground through a resistance (R5). The emitter 506 is connected to ground through a resistance (R6), and the collector 508 is the output terminal of generator 322. One skilled in the art will recognize that there are a wide variety of ways to implement generator 322 and that FIG. 5 is used merely for illustration and not limitation.

The merits of the invention are many. For example, the present invention improves control of the output power in the situations where there is an impedance mismatch at the output. Additionally, amplitude detector circuit 220 together with the current sensing protects power amplifier 102 from over voltage peaks.

While various embodiments of the present invention have been described above, it should be understood that they have been presented by way of example, and not limitation. It will be understood by those skilled in the art that various changes in form and detail may be made therein without departing from the spirit and scope of the invention as defined by the following claims. Thus the breadth and scope of the present invention should not be limited by any of the above-described exemplary embodiments, but should be defined only in accordance with the following claims and their equivalents.

What is claimed is:

1. A circuit for amplifying an input signal, comprising:
   a power amplifier that receives the input signal and produces an output signal;
   an amplitude detector coupled to an output of the power amplifier that produces a first measurement that corresponds to the amplitude of the output signal;
   a power source for providing power to the power amplifier;
   a current detector that produces a second measurement that corresponds to the current flowing into the power amplifier from the power source;
   an adder for adding the first measurement with the second measurement to produce a third measurement; and a control circuit connected to a biasing pin of the power amplifier for comparing the third measurement to a reference and for controlling the output power of the power amplifier based on the comparison.

2. The circuit of claim 1, wherein the amplitude detector comprises an envelope detector.

3. The circuit of claim 2, wherein the envelope detector comprises a diode and a resistor connected in parallel with a capacitor, wherein the diode is connected in series with the resistor and the capacitor.

4. The circuit of claim 3, wherein the amplitude detector further comprises a voltage to current generator that receives an output voltage from the envelope detector and converts the output voltage to a current.

5. The circuit of claim 4, wherein the voltage to current generator comprises a transistor.

6. The circuit of claim 1, wherein the current detector comprises a first resistor and the adder comprises a second resistor, wherein the resistance of the second resistor is larger than the resistance of the first resistor.

7. A mobile communication device comprising a circuit according to claim 1.

8. A circuit for amplifying an input signal, comprising:
   a power amplifier that receives the input signal and produces an output signal;
   an amplitude detector means, coupled to an output of the power amplifier, for producing a first measurement that corresponds to the amplitude of the output signal;
   a means for providing power to the power amplifier;
   a current detector means for producing a second measurement that corresponds to a current flowing into the power amplifier from the power providing means;
   an adding means for adding the first measurement with the second measurement to produce a third measurement; and
   a control circuit means, connected to a biasing pin of the power amplifier, for comparing the third measurement to a reference and for controlling the output power of the power amplifier based on the comparison.

9. The circuit of claim 8 wherein the amplitude detector means comprises an envelope detector.

10. The circuit of claim 9, wherein the envelope detector comprises a diode and a resistor connected in parallel with a capacitor, wherein the diode is connected in series with the resistor and the capacitor.

11. The circuit of claim 10, wherein the amplitude detector means further comprises a voltage to current generator means for receiving an output voltage from the envelope detector and converting the output voltage to a current.

12. The circuit of claim 11, wherein the voltage to current generator means comprises a transistor.

13. The circuit of claim 8, wherein the current detector means comprises a first resistor and the adding means comprises a second resistor, wherein the resistance of the second resistor is larger than the resistance of the first resistor.

14. A mobile communication device comprising a circuit according to claim 8.

15. A method, comprising the steps of:
   producing a first measurement corresponding to the amount of current flowing into a power amplifier from a power source;
   producing a second measurement corresponding to the amplitude of an output signal produced by the power amplifier;
   adding the first measurement to the second measurement to produce a sum;
   comparing the sum to a reference;
   controlling the power amplifier based on a result of the comparison.

16. The method of claim 15, wherein the step of controlling the power amplifier comprises the step of applying a voltage to a biasing pin of the power amplifier.

17. The method of claim 16, wherein the magnitude of the voltage is a function of the difference between the sum and the reference.

* * * * *